United States Patent
Collura et al.

(10) Patent No.: US 8,427,799 B2
(45) Date of Patent: Apr. 23, 2013

(54) ESD CLAMP FOR MULTI-BONDED PINS

(75) Inventors: Claudio Collura, Hertford (GB); Allan R. Warrington, Chislehurst (GB); Neil E. Robinson, Ayot St Lawrence (GB)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 13/223,482

(22) Filed: Sep. 1, 2011

(65) Prior Publication Data
US 2012/0200962 A1 Aug. 9, 2012

Related U.S. Application Data

(60) Provisional application No. 61/439,420, filed on Feb. 4, 2011.

(51) Int. Cl.
*H02H 9/00* (2006.01)
*H02H 1/00* (2006.01)
*H02H 1/04* (2006.01)
*H02H 3/22* (2006.01)

(52) U.S. Cl.
USPC .............................. 361/56; 396/118; 396/91.1

(58) Field of Classification Search ...................... 361/56
See application file for complete search history.

(56) References Cited

U.S. PATENT DOCUMENTS

| | | | |
|---|---|---|---|
| 5,239,440 A | 8/1993 | Merrill | |
| 5,900,643 A | 5/1999 | Preslar et al. | |
| 6,424,028 B1 | 7/2002 | Dickinson | |
| 6,842,318 B2 * | 1/2005 | Comeau | 361/56 |
| 6,873,505 B2 * | 3/2005 | Chen et al. | 361/56 |
| 6,967,826 B2 * | 11/2005 | Roohparvar | 361/56 |
| 2006/0092589 A1 | 5/2006 | Bhattacharya et al. | |
| 2008/0123231 A1* | 5/2008 | Kim | 361/56 |

OTHER PUBLICATIONS

International Searching Authority, "International Search Report and Written Opinion", Mailed Aug. 22, 2012, pp. 19, Published in: WO.

* cited by examiner

*Primary Examiner* — Dharti Patel
(74) *Attorney, Agent, or Firm* — Fogg & Powers LLC

(57) ABSTRACT

A circuit comprises a plurality of segments and a clamp circuit. Each of the plurality of segments comprises a bond pad coupled to a multi-bonded pin via a respective bond wire and a conductor coupling the bond pad to a respective internal connection. The bond pad from each of the plurality of segments is coupled to the same multi-bonded pin. The clamp circuit comprises a plurality of input pins and a plurality of clamp transistors. Each input pin is coupled to the bond pad of a respective one of the plurality of segments via the respective conductor. Each clamp transistor is coupled to a respective one of the input pins, wherein each of the plurality of clamp transistors is configured to prevent a voltage on the respective conductor from exceeding a respective voltage limit.

17 Claims, 5 Drawing Sheets

US 8,427,799 B2

ESD CLAMP FOR MULTI-BONDED PINS

CROSS REFERENCE TO RELATED APPLICATIONS

This application is related to U.S. provisional patent application Ser. No. 61/439,420 entitled "ESD TRANSIENT CLAMP FOR MULTI-BONDED PINS," filed on Feb. 4, 2011 and referred to herein as the '420 application. The '420 application is hereby incorporated herein by reference. The present application hereby claims priority to U.S. Provisional Patent Application No. 61/439,420.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. The following detailed description is, therefore, not to be taken in a limiting sense.

Figure 1:
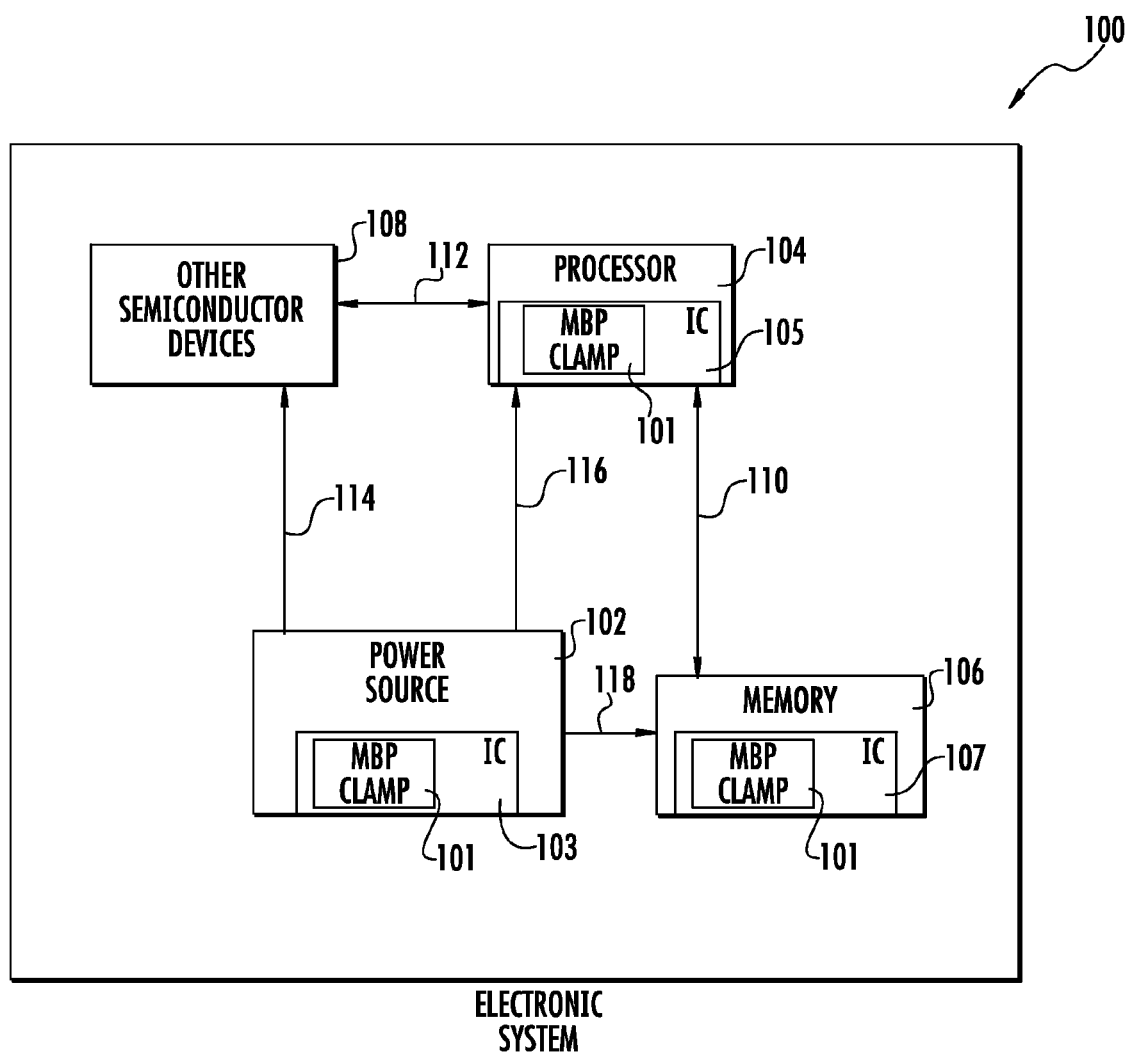
FIG. 1 is a block diagram of one embodiment of an exemplary electronic system.

FIG. 1 is a block diagram of one embodiment of an exemplary electronic system 100, which includes one or more multi-bonded pin (MBP) clamps 101. In the exemplary implementation shown in FIG. 1, electronic system 100 includes a power source 102 and a plurality of power consuming devices. In particular, the power consuming devices included in exemplary system 100 include a processor 104, a memory 106, and one or more other semiconductor devices 108. As used herein, a power consuming device is a device that requires power from the power source 102 to operate. The power source 102 can be a mains direct current (DC) or alternating current (AC) power supply, a power converter or adapter configured to convert a mains power to a voltage and/or frequency usable by the electronic system, a power management system, a battery-based power supply system, and the like.

The processor 104 can be implemented as, but is not limited to, a microprocessor, microcontroller, embedded processor, digital signal processor, analog signal processor, data processor, light data processor, or a combination of the above. The memory 106 can be implemented as, but is not limited to, a static random access memory (SRAM), dynamic RAM (DRAM), read only memory (ROM), programmable ROM (PROM), flash memory, and the like. The other semiconductor devices 108 can be, for example, one or more integrated circuits (ICs), individual electronic circuits, electronic circuit components, or one or more electronic systems or subsystems that include a combination of the above. The power source 102 provides operating power to the processor 104, memory 106, and the other semiconductor devices 108 via the respective electrical conduction lines 116, 118, and 114. The processor 104 is coupled to the memory 106 and other semiconductor devices 108 via the respective data communication buses 110, 112 to provide data communications therebetween.

In the implementation shown in FIG. 1, each one of the power source 102, processor 104, and memory 106 includes a respective IC 103, 105, 107. Each of the IC 103, 105, 107 in this example, includes a multi-bonded pin clamp 101. As used herein, the term "multi-bonded pin" refers to a pin in an circuit which is bonded or coupled to more than one bonding wire. Hence, a multi-bonded pin clamp is a clamp configured to protect the plurality of bonding wires coupled to the same single multi-bonded pin from overvoltage situations such as an electrostatic discharge (ESD) event. In some embodiments, the multi-bonded pin is a power supply pin. However, it is to be understood that an MBP clamp 101 is applied to other types of pins in other embodiments. In addition, it is to be understood that, although embodiments of a multi-bonded pin clamp are described herein as being implemented in an integrated circuit, the multi-bonded pin clamp can be implemented in non-integrated circuits, such as discrete components coupled to a single pin, in other embodiments.

Although each of the power source 102, processor 104, and memory 106 include an MBP clamp in this example, it is to be understood that, in other embodiments, an MBP clamp is not included in each component. In addition, it is to be understood that, in some implementations, an MBP clamp 101 is also included in one or more of the other semiconductor devices 108. In addition, it is to be understood that one or more of the processor 104, memory 106 and other semiconductor devices can be omitted in other embodiments.

Figure 2:
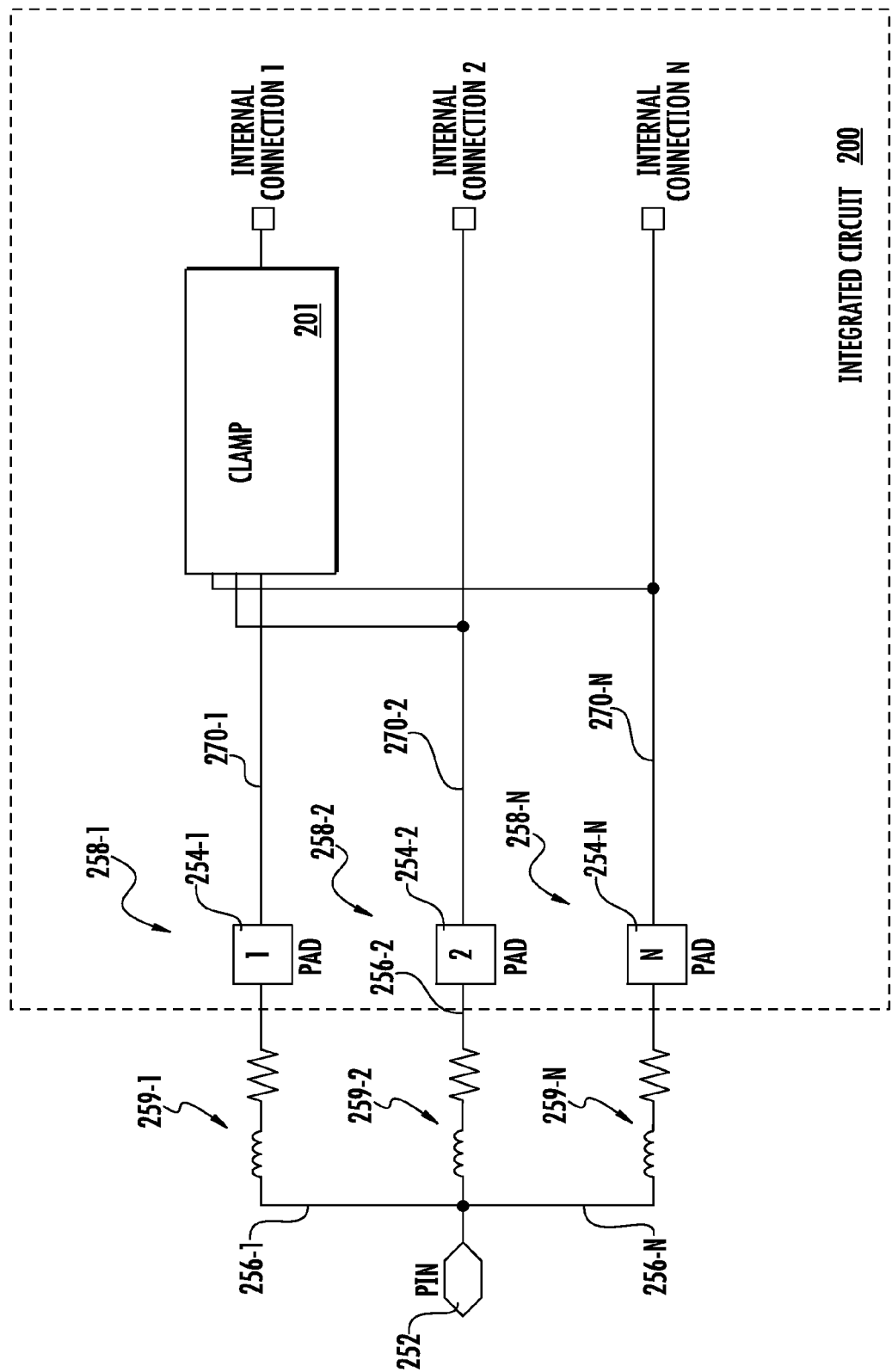
FIG. 2 is a high-level block diagram of one embodiment of an exemplary integrated circuit having a multi-bonded pin clamp.

An exemplary IC 200 having a multi-bonded pin clamp 201 is shown in FIG. 2. It is to be understood that the IC 200 is provided by way of example and not by way of limitation. In particular, it is to be understood that the IC 200 can include additional electronic circuit components (e.g. transistors, resistors, capacitors) other than those shown. For example, as shown in FIG. 2, each of the bond pads 254-1 . . . 254-N is coupled to a respective internal connection 1 . . . N via a respective conductor 270-1 . . . 270-N. The conductors 270 can be implemented, for example, as metal layers in an integrated circuit and/or as conductive vias in an integrated circuit. Each internal connection 1 . . . N couples the respective bond pad 254 to other circuit components in the IC. Alternatively, the clamp 201 can be formed off-chip. In other words, each of the internal connections 1 . . . N provides a connection to an integrated circuit that is not formed on the same substrate as the clamp 201. The particular electronic circuit components used in a given IC are dependent on the implementation of the IC and required functions and characteristics of the IC.

As shown in the example in FIG. 2, the IC 200 is coupled to a multi-bonded pin 252. The pin 252 is coupled to a plurality of bond pads 254-1 . . . 254-N via respective bonding wires 256-1 . . . 256-N. Each bonding wire 256-1 . . . 256-N includes respective bonding parasitics 259-1 . . . 259-N shown as discrete inductors and resistors in FIG. 2. Due to the bonding parasitics 259, the internal voltage applied to each respective bond pad 254 is influenced by the voltage on the other bonding wires 256. In the example of FIG. 2, three bond pads 254 are coupled to the pin 252. However, it is to be understood that, in other implementations, two or more than three bond pads 254 are used. As shown in FIG. 2, each bond pad 254 is electrically coupled to the clamp 201 (also referred to herein as a multi-bonded pin clamp). However, a trigger in the clamp 201 is only coupled to one of the legs 258-1 . . . 258-N or segments, in this embodiment, as described in more detail below. As used herein, a leg or segment includes a bond pad 254, the respective bonding wires 256 that couple the bond pad to the pin 252, and the respective conductor 270.

Figure 3:
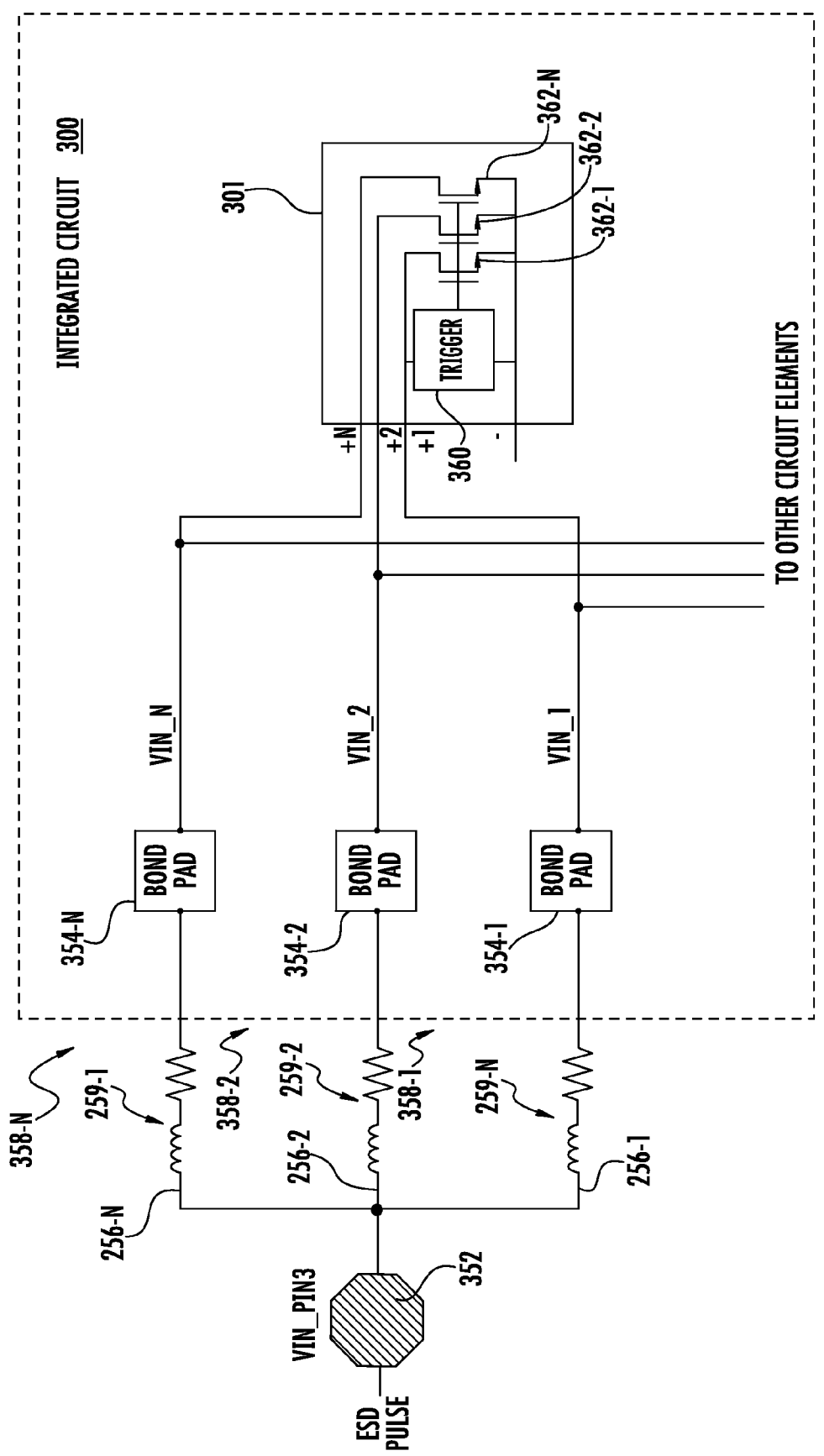
FIG. 3 is a block diagram of one embodiment of an exemplary integrated circuit having a multi-bonded pin clamp.

The exemplary IC 300 shown in FIG. 3 depicts the connection of the legs 358-1 . . . 358-N to the clamp 301. As shown in FIG. 3, an input voltage is supplied via each bond pad 354 to the clamp 301. The input voltages supplied via bond pads 354-1 . . . 354-N are denoted as VIN_1, VIN_2, and VIN_N, respectively. VIN_1 is provided to the plus 1 (+1) input of the clamp 301. Similarly, VIN_2 is provided to the plus 2 (+2) input and VIN_N is provided to the plus N (+N) input. During normal operating conditions, the clamp 301 is configured such that the input voltages are not altered by the clamp 301. Thus, the power loss due to the clamp 301 under normal operating conditions is null to negligible.

When an ESD event occurs, a fast-moving pulse travels across the pin 352 and bond pads 354 into the clamp 301. As shown in FIG. 3, only leg 358-1 is coupled to the trigger 360 in clamp 301 in this example. Thus, the voltage VIN_1 is passed into trigger 360. The trigger 360 is configured to monitor the voltage level of the voltage VIN_1 which is representative of the voltage at the respective bond pad 354-1. For example, when the voltage level of VIN_1 exceeds a predetermined or threshold value, the trigger 360 outputs a signal which causes each of the clamp transistors 362-1 . . . 362-N to turn on at approximately the same time. In other embodiments, the trigger 360 causes the clamp transistors 362-1 . . . 362-N to turn on when the rate of change of voltage level of VIN_1 exceeds a predetermined or threshold value.

As used herein, turning on the clamp transistors 362 refers to placing the clamp transistors in a state in which they are able to limit the voltage level at the respective bond pad 354 to a voltage level that is less than a level which would cause damage to the integrated circuit 300. The trigger 360 causes the clamp transistors 362 to turn off when the voltage level of VIN_1 drops below another predetermined value, or when the rate of change of voltage level of VIN_1 falls below another predetermined value, after a predetermined delay. It is to be understood that different threshold values can be used to determine when to turn on and when to turn off the clamp transistors 362 in order to prevent rapid succession of turning on and off the clamp transistors. In addition, it is to be understood that a separate trigger is coupled to each input pin and corresponding clamp transistor 362 in other embodiments. In such embodiments, each clamp transistor 362 is turned on and off by its respective trigger.

The clamp 301 includes clamp transistors 362-1 . . . 262-N coupled to the +1, +2, and +N inputs, respectively. In this embodiment, the transistors are implemented as metal-oxide-semiconductor field-effect transistors (MOSFET). However, it is to be understood that other transistors can be used in other embodiments, such as, but not limited to, bipolar junction transistors (BJT) and junction gate field-effect transistor (JFET). Each transistor 362-1 . . . 362-N is configured to prevent the voltage on the respective input line from exceeding a predetermined voltage. For example, in some embodiments, the transistors 362-1 . . . 362-N can be configured to limit the voltage to 5 volts. In other embodiments, the voltage is limited to other voltage values. Exemplary voltage limits include, but are not limited to, 0.8 volts, 1 volt, 1.8 volts, 2 volts, 2.5 volts, 3 volts, 3.3 volts, 7.3 volts, and 12 volts. The voltage limit is determined based on the requirements of the other circuit components in the IC 300.

The size of each transistor 362 is dependent on the maximum voltage limited by the transistor. For example, the lower the maximum voltage, the larger the transistor. In addition, although each transistor 362 is configured, in this example, to limit the voltage on the respective input to the same maximum voltage, it is to be understood that the maximum voltage limited by each transistor 362 can be different than the maximum voltage limited by the other transistors 362, in other embodiments. Hence, the transistors 362-1 . . . 362-N can have different sizes. Operation of an exemplary multi-bonded pin clamp is discussed in more detail below with respect to FIG. 4.

Figure 4:
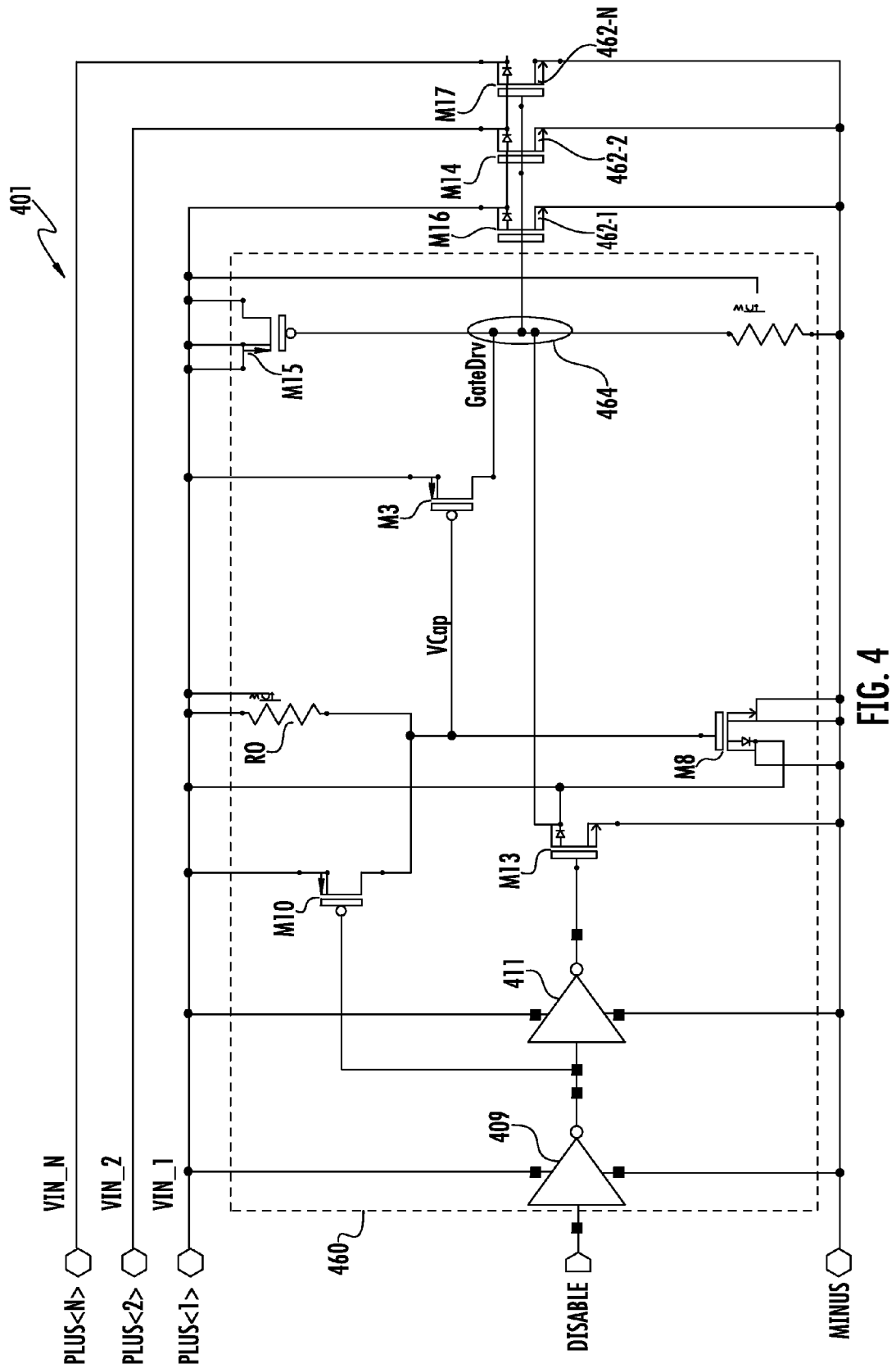
FIG. 4 is a circuit schematic of one embodiment of an exemplary multi-bonded pin clamp.

FIG. 4 is a block diagram of an exemplary embodiment of a multi-bonded pin clamp 401. It is to be understood that clamp 401 is provided by way of example and that the electronic components shown in clamp 401 may vary based on the specific implementation of the clamp 401. Clamp 401 includes a plurality of inputs labeled in FIG. 4 as Plus<1>, Plus<2>, and Plus<N>, where N is the total number of bonding wires coupled to the same pin in the IC. Each input is coupled to one of the multiple bonding wires that are bonded to the same pin.

Each of the plurality of inputs of the clamp 401 is coupled to a respective clamp transistor 462 in the clamp 401 as shown. The clamp transistors 462-1 . . . 462-N are also labeled as M16, M14, and M17 in FIG. 4. A clamp transistor, as used herein, is a transistor configured to clamp the voltage on the respective line to a maximum voltage limit. The transistors M3, M8, M10, M13, and M15; logic converters 409 and 411; and resistor R0 form part of the trigger 460, in this example. Thus, as shown in FIG. 4, each clamp transistor is coupled to one of the inputs (also referred to herein as input pins) and the trigger 460 is coupled to only one of the inputs (e.g. input Plus<1> in this example.)

In the trigger 460, the transistor M15 is coupled to the Plus<1> line and acts as a capacitor. When an ESD event occurs, the high voltage on the Plus<1> line causes the transistor M15 to pull the gate drive signal up. When the gate drive signal is pulled up, the transistors M16, M14, and M17 are switched on and pull the voltage on the Plus<1>, Plus<2> and Plus<N> lines, respectively, to the voltage limit. In this example, the voltage limit is 5 volts. However, it is to be understood that other limits can be used in other embodiments. In addition, it is to be understood that trigger 460 is presented by way of example and not by way of limitation. In particular, other trigger circuits can be used to turn on and off the clamp transistors 462.

The resistor R0 and transistor M8 are connected to the voltage Vcap which causes the voltage Vcap to stay near the ground rail initially. The transistor M8 holds the voltage Vcap down initially and slowly discharges Vcap through the resistor R0. Immediately after the fast voltage rise on the Plus<1> line, the transistor M3 turns on which causes the voltage at the gate drive to be pulled up. The combination of switching transistors M3 and M15 acts to pull up the gate drive nodes 464 when an ESD event occurs. Pulling up the gate drive nodes 464 turns on the transistors M16, M14, and M17. When turned on, the transistors M16, M14, and M17 hold the voltage on the respective Plus<1>, Plus<2>, and Plus<N> lines to the voltage limit.

During normal operation, the clamp 401 is configured such that the transistors M16, M14, and M17 do not switch on erroneously. In particular, during normal operation the signal pulse labeled DISABLE goes high. When the signal pulse DISABLE is high, the output of the logic converter 409 goes low. When the output of the logic converter 409 goes low, the transistor M10 is switched on. When turned on, the transistor M10 holds the voltage Vcap high which turns the transistor M3 off and prevents the transistor M3 from pulling up the voltage at the gate drive nodes 464.

Similarly, when the signal pulse DISABLE goes high, the output of logic converter 411 goes high which turns on transistor M13. Transistor M13 pulls the gate drive nodes 464 down, thus, preventing transistors M16, M14, and M17 from switching on. Hence, during normal operation, the transistors M13 and M3 prevent the transistors M16, M14 and M17 from switching on. As a result, the transistors M16, M14, and M17 are only switched on during an ESD discharge. By only turning on during an ESD discharge, noise due to the clamp 401, as well as the risk of damage to the clamp 401, is reduced.

Figure 5:
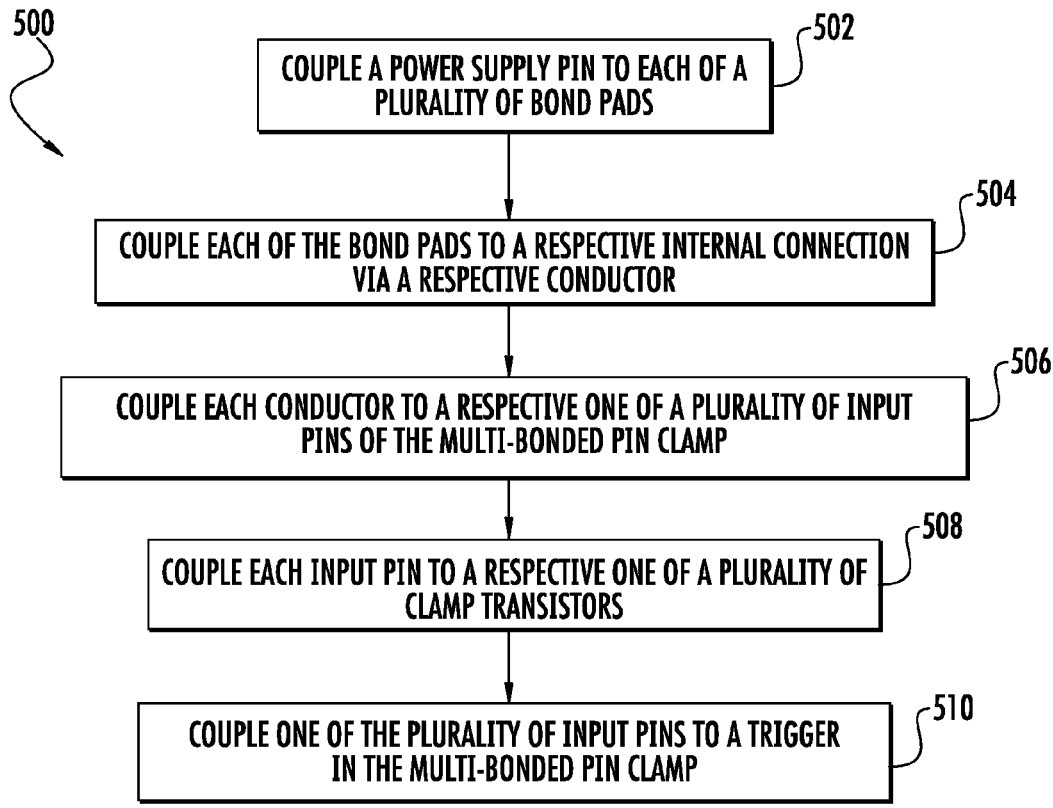
FIG. 5 is a flow chart depicting one embodiment of a method of designing an integrated circuit having a multi-bonded pin clamp

FIG. 5 is a flow chart of one embodiment of a method 500 of designing an integrated circuit having a multi-bonded pin clamp. It is to be understood that nothing in FIG. 5 or the description of method 500 is to be construed as limiting the order in which the individual acts can be performed. At block 502, a multi-bonded pin is coupled to each of a plurality of bond pads. In particular, the multi-bonded pin is coupled to each bond pad via a respective bond wire as discussed above. At block 504, each of the bond pads is coupled to a respective internal connection via a respective conductor as discussed above. The internal connection is a connection between the respective bond pad and other circuit elements in the integrated circuit. At block 506, each conductor is coupled to a respective one of a plurality of input pins of the multi-bonded pin clamp. At block 508, each input pin is coupled to a respective one of a plurality of clamp transistors. Each clamp transistor is configured to prevent a voltage on the respective conductor from exceeding a respective voltage limit. At block 510, only one of the plurality of input pins is coupled to a trigger in the multi-bonded pin clamp, in this embodiment. Thus, the trigger is electrically coupled to only one bond pad via the respective input pin and wire connection. The trigger is configured to turn on and off each of the clamp transistors at approximately the same time in response to the voltage levels on the respective conductor coupled to the trigger. Although only one trigger is used in this embodiment, is to be understood that more than one trigger can be used in other embodiments. For example, a separate trigger can be used for each clamp transistor. Alternatively, a single trigger can be used for some of the clamp transistors and a separate trigger for others of the clamp transistors.

Figure 6:
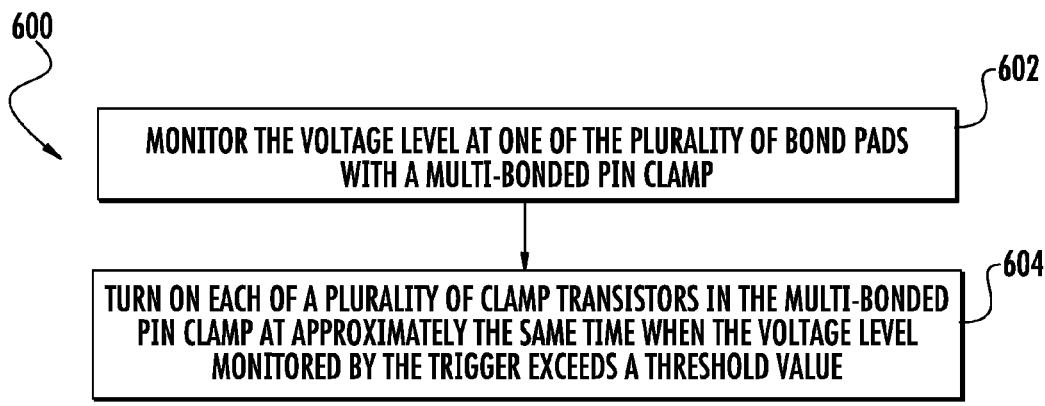
FIG. 6 is a flow chart of one embodiment of a method of clamping voltage in an integrated circuit having a plurality of bond pads coupled to a multi-bonded pin.

FIG. 6 is a flow chart of one embodiment of a method 600 of clamping voltage in an integrated circuit having a plurality of bond pads coupled to a multi-bonded pin. At block 602, the voltage level at only one of the plurality of bond pads is monitored with a multi-bonded pin clamp. In particular, in this example, a trigger in the multi-bonded pin clamp is only electrically coupled to one of the bond pads to monitor voltage levels of that respective bond pad. At block 604, each of a plurality of clamp transistors in the multi-bonded pin clamp are turned on at approximately the same time when the voltage level monitored by the trigger exceeds a threshold value. Each of the clamp transistors is coupled to a different bond pad and configured to prevent voltage levels at the respective bond pad from exceeding a respective voltage limit. In addition, turning on each of the plurality of clamp transistors also includes, in some embodiments, preventing each of the plurality of clamp transistor from being turned on unless an electrostatic discharge (ESD) event occurs as discussed above.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A circuit comprising:
a plurality of segments, wherein each segment comprises:
a bond pad coupled to a multi-bonded pin via a respective bond wire, wherein the bond pad from each of the plurality of segments is coupled to the same multi-bonded pin; and
a conductor coupling the bond pad to a respective internal connection;
the circuit further comprising a clamp circuit wherein the clamp circuit comprises:
a plurality of input pins, each input pin coupled to the bond pad of a respective one of the plurality of segments via the respective conductor; and
a plurality of clamp transistors, each clamp transistor coupled to a respective one of the input pins, wherein each of the plurality of clamp transistors is configured to prevent a voltage on the respective conductor from exceeding a respective voltage limit.

2. The circuit of claim 1, wherein the respective voltage limit for each of the plurality of clamp transistors is equal to the respective voltage limit of the other clamp transistors.

3. The circuit of claim 2, wherein each of the plurality of clamp transistors is configured to prevent the voltage on the respective conductor from exceeding one of 0.8 volts, 1 volt, 1.8 volts, 2 volts, 2.5 volts, 3 volts, 3.3 volts, 5 volts, 7.3 volts, and 12 volts.

4. The circuit of claim 1, wherein each of the plurality of clamp transistors is a metal oxide semiconductor field effect transistor (MOSFET).

5. The circuit of claim 1, wherein the clamp circuit further comprises a trigger configured to turn on and off each of the plurality of clamp transistors; wherein the trigger is coupled to only one of the plurality of input pins.

6. The circuit of claim 5, wherein the trigger is configured to turn on each of the plurality of clamp transistors only during an electrostatic discharge (ESD) event.

7. An electronic system comprising:
a power consuming device; and
a power source configured to provide power to the power consuming device;
wherein at least one of the power consuming device or the power source includes a multi-bonded pin clamp, the multi-bonded pin clamp comprising:
a plurality of input pins, each input pin electrically coupled to a single multi-bonded pin in the respective power consuming device or power source via a respective bond pad; and
a plurality of clamp transistors, each clamp transistor coupled to a respective one of the input pins, wherein each of the plurality of clamp transistors is configured to prevent a voltage received at the respective bond pad from exceeding a respective voltage limit.

8. The electronic system of claim 7, wherein the power source comprises one of a mains power supply, a power converter or adapter, a power management system, or a battery-based power supply system.

9. The electronic system of claim 7, wherein the power consuming device comprises one of a processor and a memory.

10. The electronic system of claim 7, wherein the respective voltage limit for each of the plurality of clamp transistors is equal to the respective voltage limit of the other clamp transistors.

11. The electronic system of claim 7, wherein each of the plurality of clamp transistors is configured to prevent the voltage received at the respective bond pad from exceeding one of 0.8 volts, 1 volt, 1.8 volts, 2 volts, 2.5 volts, 3 volts, 3.3 volts, 5 volts, 7.3 volts, and 12 volts.

12. The electronic system of claim 7, wherein each of the plurality of clamp transistors is a metal oxide semiconductor field effect transistor (MOSFET).

13. The electronic system of claim 7, wherein the multi-bonded pin clamp further comprises a trigger configured to turn on and off each of the plurality of clamp transistors;
wherein the trigger is coupled to only one of the plurality of input pins.

14. The electronic system of claim 13, wherein the trigger is configured to turn on each of the plurality of clamp transistors only during an electrostatic discharge (ESD) event.

15. A method of designing a circuit having a multi-bonded pin clamp, the method comprising:
coupling a multi-bonded pin to each of a plurality of bond pads;
coupling each bond pad to a respective internal connection via a respective conductor;
coupling each conductor to a respective one of a plurality of input pins of the multi-bonded pin clamp; and
coupling each input pin to a respective one of a plurality of clamp transistors, each clamp transistor configured to prevent a voltage on the respective conductor from exceeding a respective voltage limit.

16. The method of claim 15, wherein coupling each input pin to a respective one of the plurality of clamp transistors comprises coupling each input pin to a respective one of a plurality of metal oxide semiconductor field effect transistors.

17. The method of claim 15, further comprising coupling a trigger in the multi-bonded pin clamp to only one of the plurality of input pins, the trigger configured to turn on and off each of the plurality of clamp transistors.

* * * * *